United States Patent [19]

Rodriguez

[11] 3,996,475
[45] Dec. 7, 1976

[54] PHOTOELECTRIC CONTROLLING

[76] Inventor: Edward T. Rodriguez, 2 Linden St., Reading, Mass. 01867

[22] Filed: July 28, 1975

[21] Appl. No.: 599,710

[52] U.S. Cl. .......................... 250/551; 250/213 A; 307/311
[51] Int. Cl.[2] .................. G02B 27/00; H03K 3/42
[58] Field of Search .............. 250/211 R, 551, 552, 250/213 A; 307/117, 278, 315, 311

[56] References Cited

UNITED STATES PATENTS

| | | | |
|---|---|---|---|
| 3,476,941 | 11/1969 | Bonin | 250/211 R |
| 3,524,986 | 8/1970 | Harnden, Jr. | 307/278 X |
| 3,693,060 | 9/1972 | Joyce | 307/278 X |
| 3,708,672 | 1/1973 | Marinkovic | 250/551 X |
| 3,866,051 | 2/1975 | Shearer et al. | 307/315 X |

Primary Examiner—Alfred E. Smith
Assistant Examiner—T. N. Grigsby
Attorney, Agent, or Firm—Jerry Cohen; Charles Hieken

[57] ABSTRACT

A light source, such as a light emitting diode (LED), illuminates a cadmium sulfide or cadmium selenide photocell to lower its resistance and thereby initiate conduction in a solid-state device, such as a silicon controlled rectifier (SCR), to deliver current to a load that is interrupted by removing the light energy and restoring the photocell to its unilluminated high resistance state. A feature of the invention resides in limiting the optical energy incident upon the photocell so that its resistance remains well above the lowest resistance it can attain while still dropping to a resistance value considerably below its maximum resistance when unilluminated so that within the total resistance changes of the photocell, the small percentage resistance charge required for proper activation of the solid-state device, may be effected relatively rapidly both for turn on and turn off.

13 Claims, 7 Drawing Figures

PHOTOELECTRIC CONTROLLING

BACKGROUND OF THE INVENTION

The present invention relates in general to photoelectric controlling and more particularly concerns novel apparatus and techniques for photoelectrically controlling relatively high power levels with compact reliable solid-state apparatus capable of rapid operation.

Photoelectric solid-state relays using light-emitting diodes are known in the art. For example, U.S. Pat. No. 3,693,060 discloses a solid-state relay using an LED to energize a photosensitive FET connected to the gate electrodes of a pair of SCR's. And U.S. Pat. No. 3,418,480 discloses a lighting control circuit employing photocells and gas diodes to operate semiconductor switches.

Aiken U.S. Pat. No. 3,395,333 discloses a low-level circuit in which an incandescent lamp is biased to just below the point of incandescence where the resistance of the photocell is about to change or has changed to an insignificant degree to warm up the bulb so that shorting out the series resistor with a switch causes the photocell resistance to change rapidly. A search in class 250, subclasses 551, 552 and class 317, subclass 124 uncovered the following additional representative prior art:

| | |
|---|---|
| 3,704,376 - Lehovec | 3,040,178 - Lyman |
| 3,461,316 - Acton | 2,838,719 - Chitty |
| 3,342,996 - Crusinberry | 3,136,926 - Smith |
| 3,240,943 - White | 3,486,029 - Barrett et al. |
| 3,202,905 - Gomez | 3,708,672 - Marinkovic |
| 3,185,850 - Terlet | |

Most of these other patents fall into three basic categories of photoelectric couplers:

1. Simple two element couplers, employing different types of emitters or sensors, with usefulness for signal data transfer.
2. Simple couplers augmented by additional circuits to enhance the transfer of signal data in terms of speed or efficiency.
3. Simple couplers augmented by additional circuits to perform low power relay function.

It is an important object of this invention to provide solid-state relays having one or more of the following features:

1. Capability of operation from very low power circuits such as MOS (Metal Oxide Semiconductor) integrated circuits.
2. High speed operation without requiring semiconductor light sensors.
3. Input and output transient immunity.
4. Good thermal characteristics.
5. Commutating voltage derivative effects at high temperatures and low power factors.
6. Reliable operation over a wide range of temperatures.
7. Reliable operation in the presence of half-life degradation of LED's under continued use.
8. Convenient packaging.
9. Controlled turn-on time to reduce noise spike generation with inductive loads.
10. Relatively few parts.
11. High reliability.
12. Immunity to sensitivity degradation in a radioactive environment.
13. Circuit arrangement whereby excessive dissipation is likely to result in an OFF condition instead of an ON condition of the output solid-state device.

SUMMARY OF THE INVENTION

According to the invention, photoelectric control apparatus includes photosensitive resistance means responsive to incident light energy for ordinarily changing from a first end resistance corresponding to absence of illumination to a second end resistance corresponding to saturated illumination that is many times less than the first end resistance. There is a source of light energy for illuminating the photosensitive resistance means and means for controlling the light energy provided by the light energy source to a value which causes the photosensitive resistance means to assume a resistance value that is substantially above the second end resistance and at least substantially below the first end resistance. This assumed resistance value is a number of times greater than the second end resistance and a number of times less than the first end resistance. Typically the photocell is of cadmium sulfide or cadmium selenide, and the light source is an LED. The photosensitive resistance means is preferably intercoupled with an associated solid-state switching device, such as a transistor, triac or SCR for controlling the conducting state of these devices and thereby photoelectrically control relatively high current levels. A feature of the invention is controlling the assumed resistance value so that the turn-off time is of the order of the turn-on time. This condition typically occurs when the time derivative of the photocell resistance during turn-on and turn-off are of the same order of magnitude.

Numerous other features, objects and advantages of the invention will become apparent from the following specification when read in connection with the accompanying drawing in which:

BRIEF DESCRIPTION OF THE DRAWING

FIG. 7 is another embodiment of the invention in which momentary application of a control signal and subsequent removal results in the output device latching on.

DETAILED DESCRIPTION OF PREFERRED EMBODIMENTS

Figure 1:
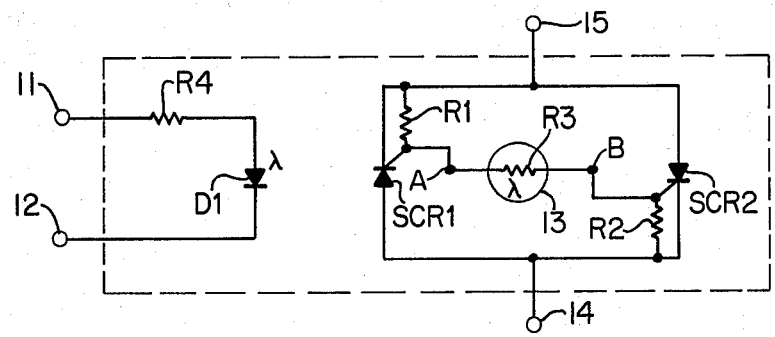
FIG. 1 is a schematic circuit diagram of an exemplary embodiment of the invention functioning as a solid-state a-c relay.

With reference now to the drawing and more particularly FIG. 1 thereof, there is shown a schematic circuit diagram of an a-c relay according to the invention. Applying a control signal between input terminals 11 and 12 illuminates LED D1 to illuminate photocell 13 and establish a low impedance path between output terminals 14 and 15 typically energized with an a-c signal. SCR1 and SCR2 are connected in anti-parallel between output terminals 14 and 15. Photocell 13 of variable resistance R3 is connected between gate electrodes A and B of SCR1 and SCR2, respectively. Resistors R1 and R2 may be the interelectrode resistances between cathode and gate of SCR1 and SCR2, respectively, and/or external resistors. Resistor R4 is connected in series with LED D1 to limit the current to a value sufficient to illuminate photocell 13 so that its resistance decreases to a value a number of times less than its dark resistance and a number of times more than its saturated light resistance. This feature of the invention will be better understood from the discussion below of FIG. 3.

The resistances R1, R2 and R3 form a three-element voltage divider between output terminals 14 and 15 when SCR1 and SCR2 are not conducting. With photocell 13 dark its resistance is typically of the order of 10 megohms, and negligible current flows. When LED D1 illuminates photocell 13, resistance R3 drops to a value between the range of 1,000 and 20,000 ohms, a number of multiples less than the 10 megohm dark resistance and a number of times more than the 100 ohms saturated light resistance so that current flows and causes conduction in that one of SCR1 and SCR2 poled to pass the contemporary polarity of the a-c signal then between terminals 14 and 15. Conduction stops when LED D1 is extinguished as the control signal is removed from terminals 11 and 12 so that photocell 13 rapidly assumes a resistance value high enough to prevent enough current from reaching a gate electrode to cause conduction.

Figure 2:
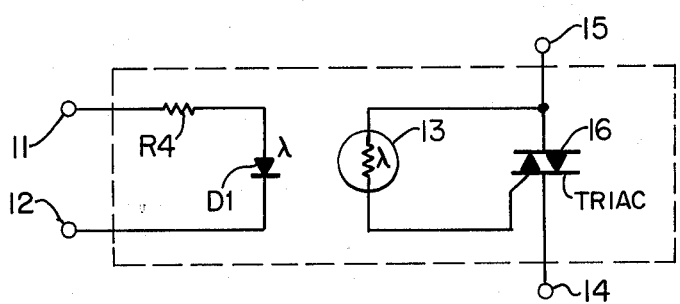
FIG. 2 is another embodiment of an a-c relay using a triac instead of a pair of SCR's.

Referring to FIG. 2, there is shown a schematic circuit diagram of another embodiment of an a-c solid-state relay according to the invention in which a single triac 16 performs the same functions as SCR1 and SCR2 and their interelectrode resistances R1 and R2.

Figure 3:
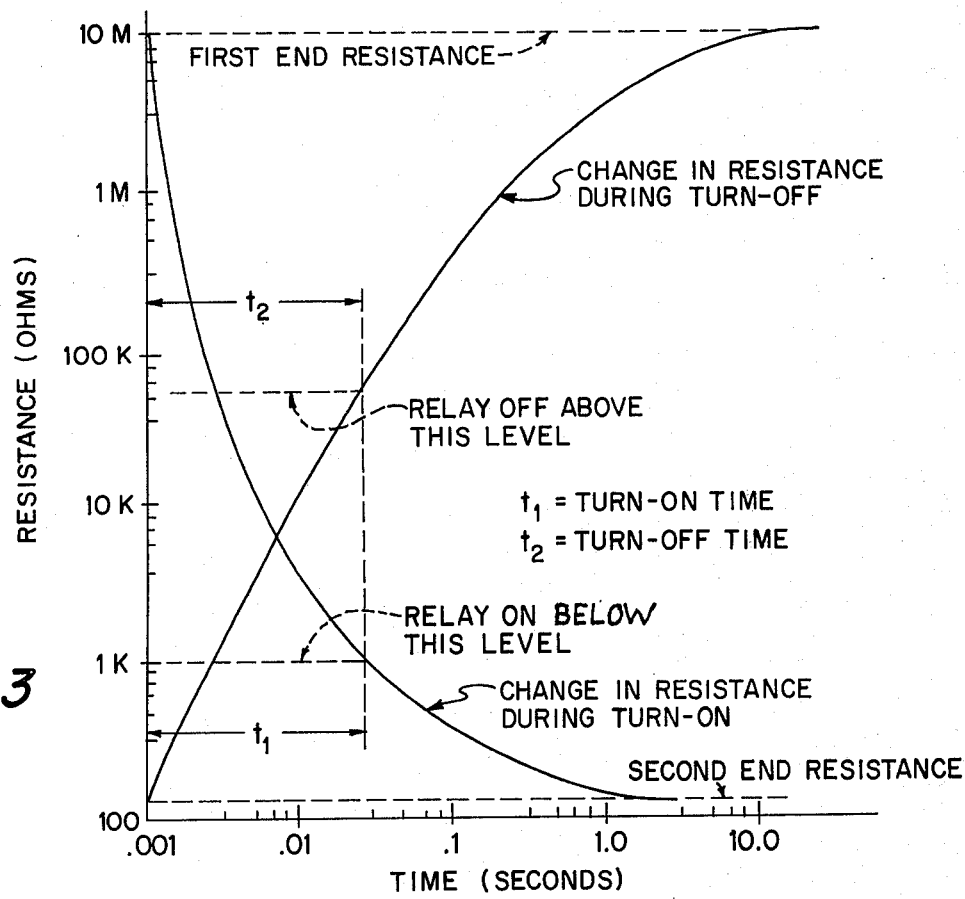
FIG. 3 is a graphical representation of photocell resistance as a function of time for a typical cadmium sulfide or cadmium selenide photocell.

Referring to FIG. 3, there is shown a graphical representation of photocell resistance during turn-on as a function of time in response to incident light energy on the photocell sufficient to drive it to saturation light resistance that is typically of the order of 100 ohms and takes of the order of two seconds to reach and during turn-off when the minimum resistance during turn-on is of the order of 900 ohms. To reach a resistance of 1000 ohms from the dark resistance of 10 megohms takes only of the order of 10 ms. and to rise to a resistance of 50,000 ohms, which is sufficient to extinguish conduction in the output switching devices, takes only 10–20 ms. By taking advantage of the dynamic properties of inexpensive cadmium sulfide and cadmium selenide photocells, the invention achieves high speed operation from devices that are ordinarily expected to operate only at low speeds.

The time derivative of the photocell resistance during turn-off is directly proportional to the minimum resistance the photocell assumes during turn-on. A typical photocell illuminated with 10 foot candles assumes a minimum resistance during turn-on of 400 ohms or less. By limiting the illumination to 2 foot candles or less, the same typical photocell assumes a minimum resistance of 900 ohms that is sufficiently low to cause turn-on and sufficiently high so that the magnitude of the time-derivative of the photocell resistance during turn-off is of the order of the magnitude of the photocell resistance time-derivative during turn-on and sufficiently large to allow turn-off to occur in a time interval of the order of the turn-on time. According to the invention, the minimum resistance assumed by the photocell during turn-on is significantly greater than that assumed by the photocell when operating conventionally. Turn-on time may be reduced by biasing the LED so that the photocell resistance in the off condition is of the order of 50,000 ohms; however, this mode is not preferred because it requires biasing energy.

With the foregoing information those skilled in the art know how to choose parameters for practicing the invention. In an exemplarly embodiment of the invention photocell 13 was a VT811X type cadmium sulfide photocell, SCR1 and SCR2 were type C122B SCR's with internal resistances R1 and R2 typically 100 ohms. LED D1 was a type RL-50 LED emitting visible near-infrared energy. Resistor R4 was 1,000 ohms, and the potential across terminals 11 and 12 was 5 volts for establishing the ON condition and 0 volts for establishing the OFF condition.

In an embodiment of the invention having ultrahigh sensitivity SCR1 and SCR2 were type 2N5064 SCR's and resistors R1 and R2 were added externally and made 470 ohms.

An advantage of the invention in arranging the inexpensive photocell to respond in milliseconds instead of microseconds as occurs with conventional LED/phototransistor pairs in solidstate relays, is that typical transient of short duration do not create sufficient change in photocell resistance to allow a buildup of current adequate to trigger the SCR's or triac.

In conventional solid-state relays using triacs, there is a stored charge effect which creates a tendency for the triac to remain conducting without an input signal, especially at elevated temperatures. The effect is more pronounced when controlling a highly inductive load or resistive loads at frequencies above 60 Hz. The inductive load and high frequency limitations occur due to there being a fast rising wavefront applied to the device at the beginning of each half cycle. This is seen as a transient spike by the device tending to cause undesired turn-on. To offset this deficiency a resistor-capacitor "snubber" network is often shunted across the triac. Another prior art approach involves using in an antiparallel or bridge configuration SCR's to circumvent the triac limitations; however, these SCR circuits generally require control circuitry which is itself susceptible to limitations under inductive load conditions. The circuit of FIG. 1 takes advantage of the characteristics of the inexpensive photocell to provide a greatly simplified transient-immune control circuit while facilitating switching at high frequencies when adjusted according to the invention.

The control signal applied between terminals 11 and 12 is preferably unipolar and poled in the same sense as LED D1. With prior art approaches, if an a-c voltage were applied between terminals 11 and 12, LED D1 might be destroyed on the negative half cycle because of reverse avalanching and excessive dissipation. If it were desired to use an a-c control signal, it would generally be applied through a bridge circuit arranged to bias LED D1 in the forward direction only.

In the preferred design LED D1 is operated at extremely low levels so that even with reverse voltage, dissipation is negligible. Thus, when using the invention for a d-c input relay, the polarity may be inadvertently reversed without damage. When using a-c control, LED D1 emits light during one-half of the cycle and is harmlessly reverse-biased on the other. Photocell 13 averages the light as though LED D1 were on continuously. The averaging effect takes place if the cell response is longer than the period of the half cycle, typically 8 milliseconds for the 60 Hz power frequency. Thus, the invention takes advantage of the relatively slow inexpensive photocell to permit the same simplified circuitry to be used for either a-c or d-c inputs.

Figure 4:
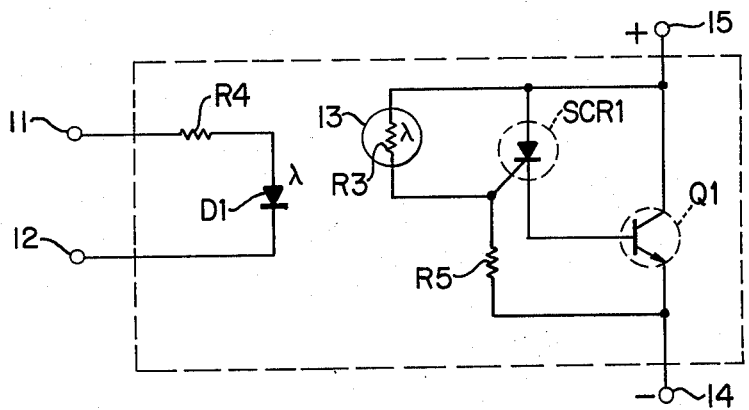
FIG. 4 is a schematic circuit diagram of a d-c relay according to the invention.

Referring to FIG. 4, there is shown another embodiment of the invention which may function as a d-c relay. Photocell 13 is connected between the anode and gate electrode of SCR1. The cathode of SCR1 is connected to the base of NPN transistor Q1 whose collector is connected to terminal 15 and emitter to terminal 14. Resistor R5 is connected between the gate of SCR1 and terminal 14.

Operation is as follows. A control signal between terminals 11 and 12 causes LED D1 to conduct and illuminate photocell 13 to reduce its resistance so that SCR1 conducts. When SCR1 conducts, it latches on and provides base current to transistor Q1 to turn that transistor on hard toward saturation. With transistor Q1 on, its emitter-base saturation voltage produces a negative bias on the gate of SCR1, attempting to turn off. SCR1 remains on because of the current delivered through resistor R5. Upon removing the control signal from terminals 11 and 12, the resistance R3 of photocell 13 returns to a high value, allowing the negative bias on the base of transistor Q1 to turn SCR1 off and remove the drive from transistor Q1. Although SCR's are latching devices and cannot normally be turned off by a negative bias once on, at low anode currents as used in this circuit, it is possible to turn the SCR off with a negative bias.

Figure 5:
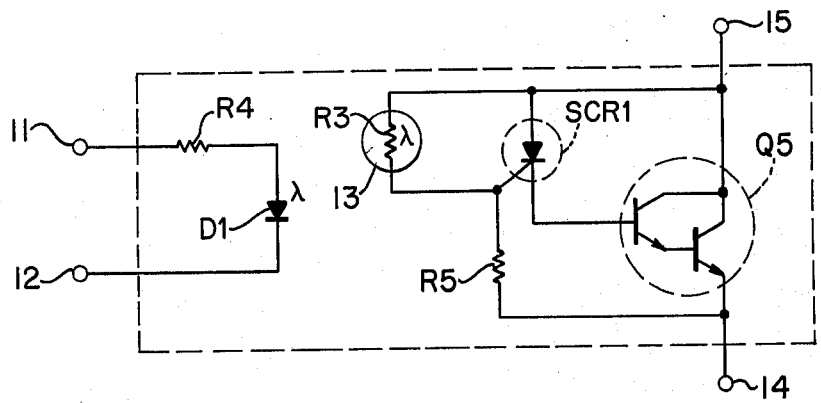
FIG. 5 is a variation of the circuit of FIG. 4 in which Darlington circuit is substituted for the single output transistor.

Referring to FIG. 5, there is shown an alternate embodiment of the invention characterized by greater efficiency and the ability to switch higher load currents by substituting a Darlington pair Q5 for transistor Q1.

A feature of the invention is that controlling a transistor with an SCR creates a snap action because the SCR is a bistable device. When the resistance R3 of photocell 13 decreases enough to deliver adquate trigger current, SCR1 snaps on and similarly snaps off when trigger current cannot overcome the negative bias. The invention is thus an electronic switch with snap action.

Figure 6:
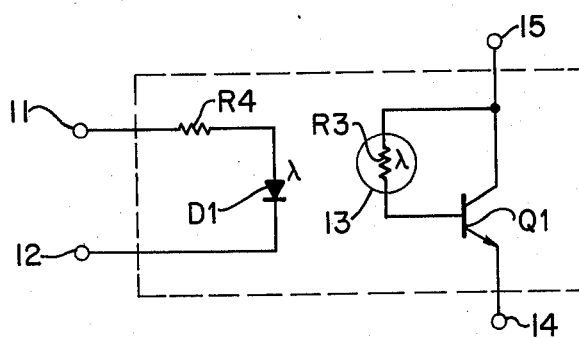
FIG. 6 is a simplified version of the circuit of FIG. 4.

FIG. 6 depicts a simplified circuit in which the photocell directly drives a transistor.

Figure 7:
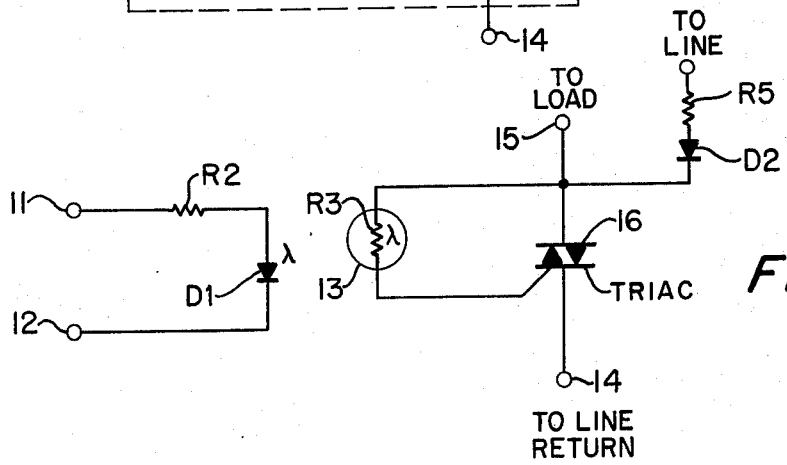

Referring to FIG. 7, there is shown another embodiment of the invention having latching action provided by a second LED D2 connected between triac 16 and resistor R5 connected to the line across the load for illuminating photocell 13 and providing latching action by holding photocell 13 in the low resistance state after the input signal ends. With this circuit triac 16 is restored to the nonconducting state by removing the potential between terminals 14 and 15.

There has been described novel apparatus and techniques for providing solid-state relays having the numerous advantages enumerated above. It is evident that those skilled in the art may now make numerous modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. Photoelectric control apparatus comprising,
photosensitive resistance means responsive to incident light energy for ordinarily changing from a first end resistance corresponding to absence of illumination to a second end resistance corresponding to saturated illumination that is many times less than said first end resistance,
a source of light energy for illuminating said photosensitive resistance means,
and means for controlling the light energy provided by said source to a value which causes said photosensitive resistance means to assume a resistance value that is always significantly above said second end resistance and much lower than said first end resistance so that the turn-off time of said photosensitive resistance means is of the order of the turn-on time thereof.

2. Photoelectric control apparatus in accordance with claim 1 wherein said means for controlling the light energy provided by said source includes means for establishing said value at a resistance so that the time-derivatives of the photosensitive resistance means resistance during turn-on and turn-off are of the same order of magnitude.

3. Photoelectric control apparatus in accordance with claim 1 wherein said photosensitive resistance means comprises a cadmium compound.

4. Photoelectric control apparatus in accordance with claim 3 wherein said cadmium compound is cadmium sulfide.

5. Photoelectric control apparatus in accordance with claim 3 wherein said cadmium compound is cadmium selenide.

6. Photoelectric control apparatus in accordance with claim 1 wherein said source of light energy is a LED and said means for controlling includes means for controlling the maximum energy delivered to said LED so that the light energy therefrom incident upon said photosensitive means is substantially smaller than the light energy required to drive said photosensitive means to saturation.

7. Photoelectric control apparatus in accordance with claim 1 wherein the apparatus is fully ON when the photosensitive resistance means is substantially below its first end resistance and OFF when still substantially below its first end resistance but at a level slightly higher than the level constituting an ON condition.

8. Photoelectric control apparatus in accordance with claim 1 wherein the light energy level provided by said source of light energy is such that the time to change from the first end resistance to the level constituting an ON condition is substantially less than the time to change from the first end resistance to the second end resistance and the time to change from the second end resistance to the level constituting an OFF condition is substantially less than the time to change from the second end resistance to the first end resistance.

9. Photoelectric control apparatus in accordance with claim 7 wherein said source of light energy comprises a light emitting diode and means for limiting the current thereto to less than a predetermined level to limit the maximum light intensity emitted therefrom and further comprising,
first and second silicon controlled rectifiers connected in anti-parallel having their gate electrodes intercoupled by said photosensitive resistance means for rendering said rectifiers conductive and nonconductive when said photoelectric control apparatus is in the ON and OFF conditions respectively.

10. Photoelectric control apparatus in accordance with claim 7 and further comprising solid-state switching means coupled to said photosensitive resistance means for delivering energy to a load only when said apparatus in the ON condition.

11. Photoelectric control apparatus in accordance with claim 10 wherein said solid-state switching means comprises a transistor.

12. Photoelectric control apparatus in accordance with claim 11 wherein said solid-state switching means further comprises a Darlington circuit including said transistor.

13. Photoelectric control apparatus in accordance with claim 10 and further comprising a second source of light energy responsive to said switching means delivering energy to a load for illuminating said photoelectric resistance means to provide latching action.

* * * * *